(12) United States Patent
Lee et al.

(10) Patent No.: US 9,766,486 B2
(45) Date of Patent: Sep. 19, 2017

(54) FLEXIBLE DISPLAY APPARATUSES AND METHODS OF MANUFACTURING FLEXIBLE DISPLAY APPARATUSES

(71) Applicant: Samsung Display Co., Ltd., Yongin, Gyeonggi-do (KR)

(72) Inventors: Hyun-Jae Lee, Yongin (KR); Mu-Gyeom Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 44 days.

(21) Appl. No.: 14/063,707

(22) Filed: Oct. 25, 2013

(65) Prior Publication Data
US 2014/0347827 A1  Nov. 27, 2014

(30) Foreign Application Priority Data
May 27, 2013 (KR) .......................... 10-2013-0059682

(51) Int. Cl.
*G02F 1/1333* (2006.01)
*H05K 3/32* (2006.01)

(52) U.S. Cl.
CPC ....... *G02F 1/133305* (2013.01); *H05K 3/323* (2013.01); *Y10T 29/49826* (2015.01)

(58) Field of Classification Search
CPC .............. G02F 1/133305; H05K 3/323; Y10T 29/49826
USPC .......................................... 361/749; 348/373
See application file for complete search history.

(56) References Cited

U.S. PATENT DOCUMENTS

| | | | | |
|---|---|---|---|---|
| 7,050,835 | B2* | 5/2006 | Hack | H04M 1/0208 379/447 |
| 2005/0213979 | A1* | 9/2005 | Nakashima | H04B 10/07 398/79 |
| 2005/0285963 | A1* | 12/2005 | Misawa | H04N 5/23293 348/333.06 |
| 2008/0212271 | A1* | 9/2008 | Misawa | G02F 1/133305 361/679.01 |
| 2010/0177036 | A1 | 7/2010 | Nam | |
| 2010/0277448 | A1 | 11/2010 | Okamoto et al. | |
| 2011/0007042 | A1 | 1/2011 | Miyaguchi | |
| 2012/0188153 | A1* | 7/2012 | Tziortzis | G06F 1/1641 345/156 |
| 2012/0204453 | A1 | 8/2012 | Jung | |

FOREIGN PATENT DOCUMENTS

| | | |
|---|---|---|
| JP | 2010-282183 | 12/2010 |
| JP | 2011-034066 | 2/2011 |
| KR | 10-2008-0049881 | 6/2008 |
| KR | 10-2010-0082920 | 7/2010 |
| KR | 10-2012-0093665 | 8/2012 |

* cited by examiner

*Primary Examiner* — Tuan T Dinh
*Assistant Examiner* — Rockshana Chowdhury
(74) *Attorney, Agent, or Firm* — Knobbe Martens Olson & Bear LLP

(57) ABSTRACT

A flexible display apparatus includes a main body, a rotation structure and a signal transfer portion. The main body includes a control circuit portion. The rotation structure includes a rotation body and a flexible display panel. The rotation body is capable of rotating about an axis extending in a first direction, and the flexible display panel is fixed to the rotation body. The signal transfer portion transfers a signal between the control circuit portion and the flexible display panel. A method of manufacturing the flexible display apparatus is also provided.

9 Claims, 11 Drawing Sheets

SECOND
DIRECTION  FIRST
⊗ ⟶ DIRECTION

FLEXIBLE DISPLAY APPARATUSES AND METHODS OF MANUFACTURING FLEXIBLE DISPLAY APPARATUSES

CROSS-REFERENCE TO RELATED APPLICATIONS

This application claims priority to Korean Patent Application No. 10-2013-0059682 filed on May 27, 2013 in the Korean Intellectual Property Office (KIPO), the entire disclosure of which is incorporated herein by reference.

BACKGROUND

Field

Example embodiments relate to flexible display apparatuses having an improved connection means and methods of manufacturing the same.

Description of the Related Technology

Generally, a display device is widely used not only in a stationary electric apparatus such as a monitor, a television, a digital information display (DID) apparatus, but also in a portable electric apparatus such as a notebook, a digital camera, a mobile phone, a smart phone, a smart pad, a personal digital assistant (PDA), a personal media player (PMP), a MP3 player, a navigation system, a camcorder, a portable game machine, and the like. The screen size of the display device has increased to show high resolution images. The display device having the large screen size may have a large volume, so that it is not easy to carry such display device. Therefore, a flexible display apparatus including a flexible display panel, which is foldable or rollable, has been studied recently.

SUMMARY OF CERTAIN INVENTIVE ASPECTS

Some example embodiments provide a flexible display apparatus having an improved connection means.

Some example embodiments provide a method of manufacturing a flexible display apparatus having an improved connection means.

However, objects of example embodiments are not limited to the above, but can be variously expanded without departing from the present inventive concept.

According to example embodiments, there is provided a flexible display apparatus including a main body, a rotation structure and a signal transfer portion. The main body includes a control circuit portion. The rotation structure includes a rotation body and a flexible display panel. The rotation body is configured to rotate about an axis extending in a first direction, and the flexible display panel is fixed to the rotation body. The signal transfer portion transfers a signal between the control circuit and the flexible display panel.

The flexible display apparatus may include a substrate fixed to the main body or integrally formed on the main body. The control circuit may be disposed on the substrate.

The signal transfer portion may include a contact portion including a connector or a signal pad on the substrate and a cable portion including at least one of a data line, a power line, a ground line and an input signal line or an output signal line. The cable portion may connect the contact portion with the rotation structure.

The signal transfer portion may include an optical transmitter disposed on the substrate, an optical receiver disposed in the rotation structure and an optical cable connecting the optical transmitter with the optical receiver.

The optical transmitter may include a multiplexer, a first driving circuit and a light source, and the optical receiver may include an optical sensor, a second driving circuit and a demultiplexer.

The signal transfer portion may include a wireless transmitter disposed on the substrate and a wireless receiver disposed in the rotating structure.

The wireless transmitter may include a transmitter circuit and a first antenna, and the wireless receiver may include a receiver circuit and a second antenna.

The rotating body may have a circular cylinder shape or an elliptical cylinder shape extending in the first direction.

The flexible display apparatus may further include at least one first pad, at least one second pad, at least one third pad, at least one fourth pad and an adhesive. The at least one first pad and the at least one second pad may be disposed on surfaces of the rotating body, the at least one third pad and the at least one fourth pad may be disposed at an end portion of the flexible display panel and the adhesive may be disposed between the at least one first pad and the at least one third pad and between the at least one second pad and the at least one fourth pad.

The at least one first pad may be disposed on a first surface of the rotating body exposed by the opening. The at least one second pad may be disposed on a second surface of the rotating body exposed by the opening. The at least one third pad may be disposed on an upper surface of the flexible display panel. The at least one fourth pad may be disposed on a lower surface of the flexible display panel. The first surface and the second surface may face each other, and the upper surface opposes to the lower surface.

The flexible display panel may be disposed through the opening, and the upper surface and the lower surface of the flexible display panel may be fixed to the rotation body.

According to example embodiments, there is provided a method of manufacturing a flexible display apparatus. In the method, a rotation body is provided to have a circular cylinder shape or an elliptical cylinder shape extending in a first direction. The rotation body has an opening through the rotation body in a second direction perpendicular to the first direction. At least one first pad and at least one second pad are formed on surfaces of the rotation body which is exposed by the opening. At least one third pad and at least one fourth pad are formed on an upper surface and a lower surface of the flexible display panel, respectively. Adhesives are formed on the at least one third pad and the at least one fourth pad. The flexible display panel is arranged to penetrate the opening of the rotation body. The at least one first pad and the at least one second pad are fixed with the at least one third pad and the at least one fourth pad using the adhesives, respectively.

The at least one first pad and the at least one second pad may face each other. The flexible display panel may be disposed between the at least one first pad and the at least one second pad.

Forming the at least one third pad and the at least one fourth pad comprises forming the at least one third pad on an upper surface of the flexible display panel and forming the at least one fourth pad on a lower surface of the flexible display panel.

The adhesives may include anisotropic conductive film.

Fixing the at least one first pad and the at least one second pad with the at least one third pad and the at least one fourth pad may include using a thermal compression jig.

Fixing the at least one first pad and the at least one second pad with the at least one third pad and the at least one fourth pad may include using a thermal transfer jig and a compression jig.

The adhesives may include a conductive polymer material, and the conductive polymer material may have an adhesive strength due to an ultraviolet irradiation.

According to example embodiments, a flexible display panel may be fixed to a rotation body by an adhesive. A pressure is applied from an upper surface and a lower surface of the flexible display panel, so that the flexible display panel may be firmly fixed. Even though the flexible display panel is wound or unwound repeatedly, a connection between the flexible display panel and the rotation body may not be damaged. Further, data signals may be transferred between the flexible display panel of the rotation structure and a control circuit portion of a main body through a cable, an optical cable and a wireless communication. Even though the rotation structure rotates repeatedly, a problem of cable kink may not occur, when using the wireless communication.

BRIEF DESCRIPTION OF THE DRAWINGS

Example embodiments will be more clearly understood from the following detailed description taken in conjunction with the accompanying drawings.

FIG. 1 is a cross-sectional view illustrating a flexible display apparatus in accordance with some embodiments;

FIG. 2 is a perspective view illustrating a rotation body in accordance with some embodiments;

FIG. 3 is a cross-sectional view illustrating a rotation structure in accordance with some embodiments;

FIG. 4 is a cross-sectional view illustrating a rotation structure in accordance with some embodiments;

FIG. 5 is a block diagram illustrating a circuit structure of a flexible display apparatus in accordance with some embodiments;

FIG. 6 is a cross-sectional view illustrating a connection means between a main body and a rotation structure of a flexible display apparatus in accordance with some embodiments;

FIG. 7 is a cross-sectional view illustrating a connection means between a main body and a rotation structure of a flexible display apparatus in accordance with other embodiments;

FIG. 8 is a cross-sectional view illustrating a connection means between a main body and a rotation structure of a flexible display apparatus in accordance with other embodiments;

FIGS. 9 to 13 are cross-sectional views illustrating a method of manufacturing a flexible display apparatus in accordance with some embodiments;

FIG. 14 is a cross-sectional view illustrating a step of fixing a flexible display panel and a rotation body in accordance with some embodiments;

FIG. 15 is a cross-sectional view illustrating a step of fixing a flexible display panel and a rotation body in accordance with other embodiments; and FIG. 16 is a cross-sectional view illustrating a step of fixing a flexible display panel and a rotation body in accordance with other embodiments.

DETAILED DESCRIPTION OF CERTAIN INVENTIVE EMBODIMENTS

Figure 1:
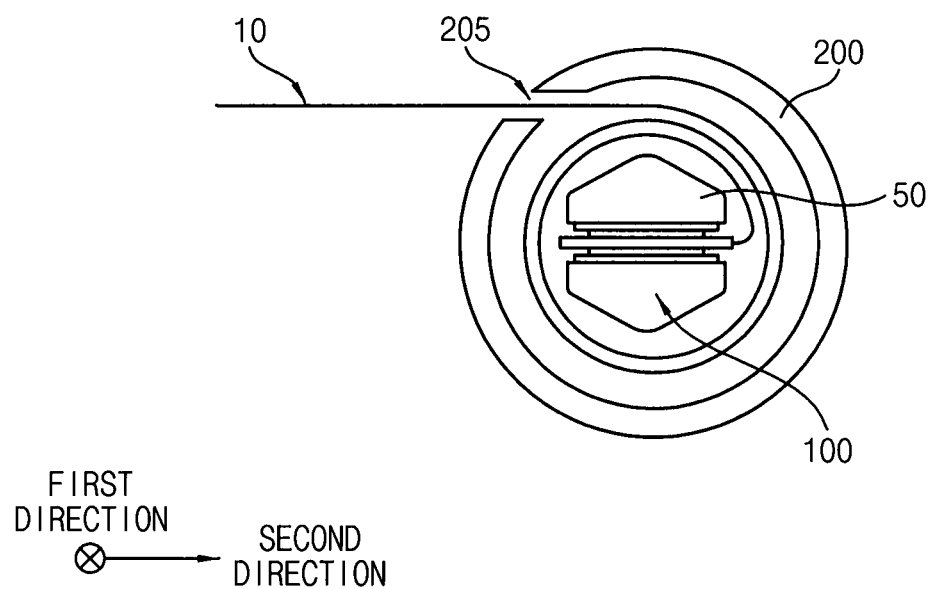
FIGS. 1 to 16 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals generally refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a flexible display apparatus in accordance with some embodiments.

Referring to FIG. 1, the flexible display apparatus may include a rotation structure 100 and a main body 200.

The rotation structure 100 may include a rotation body 50 and a flexible display panel 10. The rotation structure 100 may rotate about an axis extending in a first direction. Depending on a rotation direction, the rotation structure 100 may wind or unwind the flexible display panel 10 around an outer circumference surface thereof. That is, when the rotation structure 100 rotates in a clockwise direction, the flexible display panel 10 may be wound around the outer circumference surface of the rotation structure 100. On the other hand, when the rotation structure 100 rotates in a counter clockwise direction, the flexible display panel 10 may be unwound from the outer circumference surface of the rotation structure 100.

In example embodiments, the rotation structure 100 may be connected to an elastic body, such as a spring or clockwork. Therefore, the rotation structure 100 may rotate due to the elastic strength of the elastic body. In other example embodiments, the rotation structure 100 may be connected to an electric motor. Therefore, the rotation structure 100 may rotate by an electrical signal.

The main body 200 may surround the rotation structure 100. That is, the main body may protect the flexible display panel 10 of the rotation structure 100 from an external environment. In example embodiments, the main body 200 may have a circular cylinder shape, an elliptical cylinder shape or a polygonal cylinder shape. Also, the main body 200 may have a hollow space for receiving the rotation structure 100. The main body 200 may have an opening 205 that may expose the hollow space to the external environment. The flexible display panel 10 may be turned under the main body 200 through the opening 205, or may be stretched out through the opening 205. The main body 200 may hold end portions of the rotation structure 100, and the rotation structure 100 may be rotatably fixed in the main body 200.

According to example embodiments, when the flexible display apparatus is used, the flexible display panel 10 may be stretched out from the main body 200, so that the flexible display apparatus may have a relatively large display area. When the flexible display apparatus is not used, the flexible display panel 10 may be turned under the main body 200, so that the flexible display apparatus may have a small volume.

Figure 2:
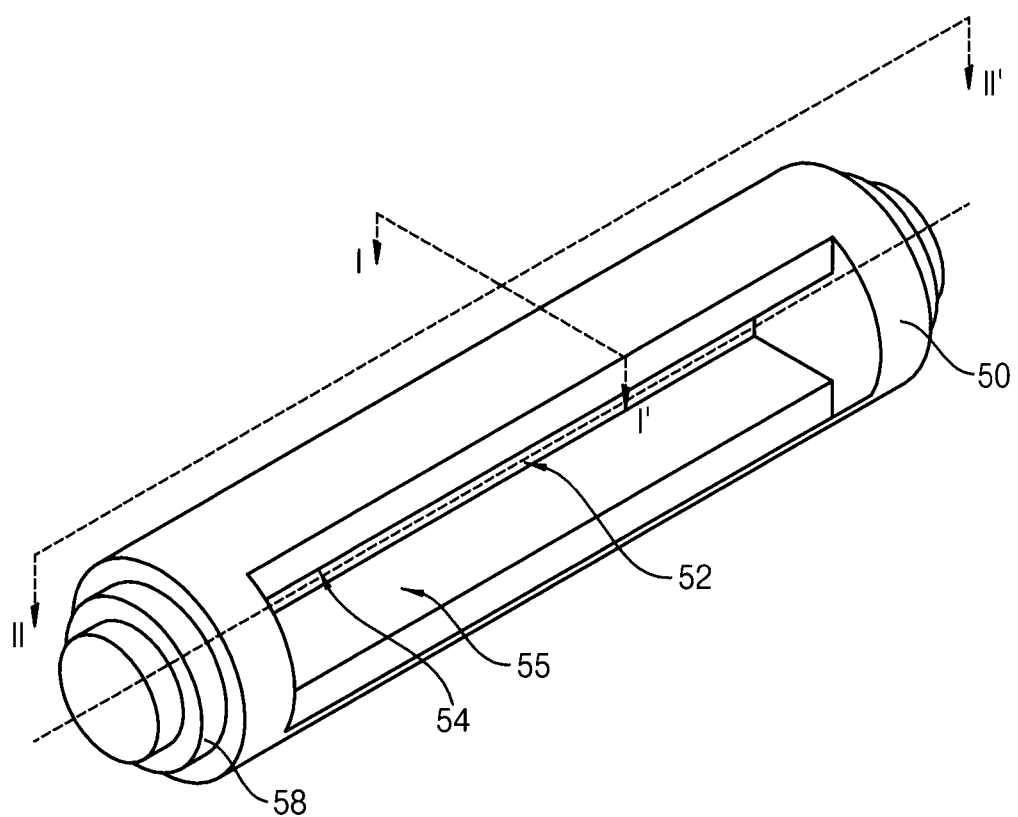
Figure 2:
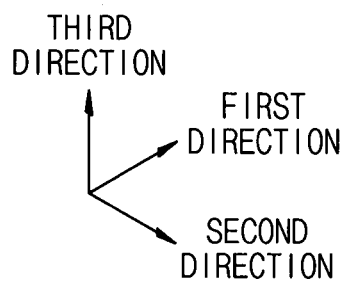
Figure 3:
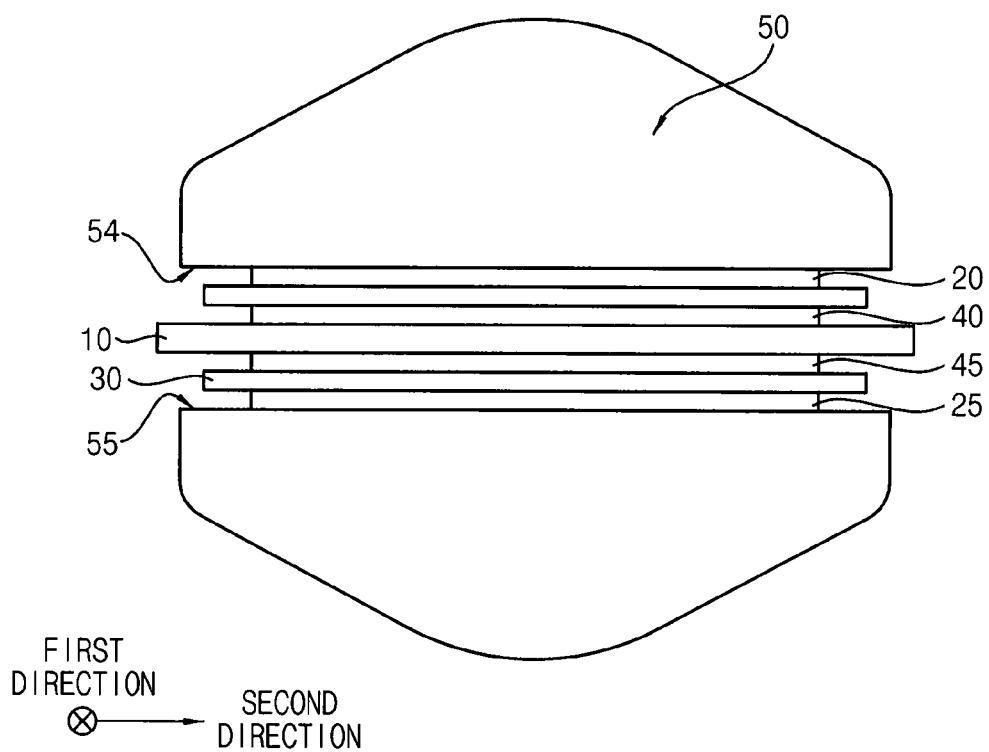
Figure 4:
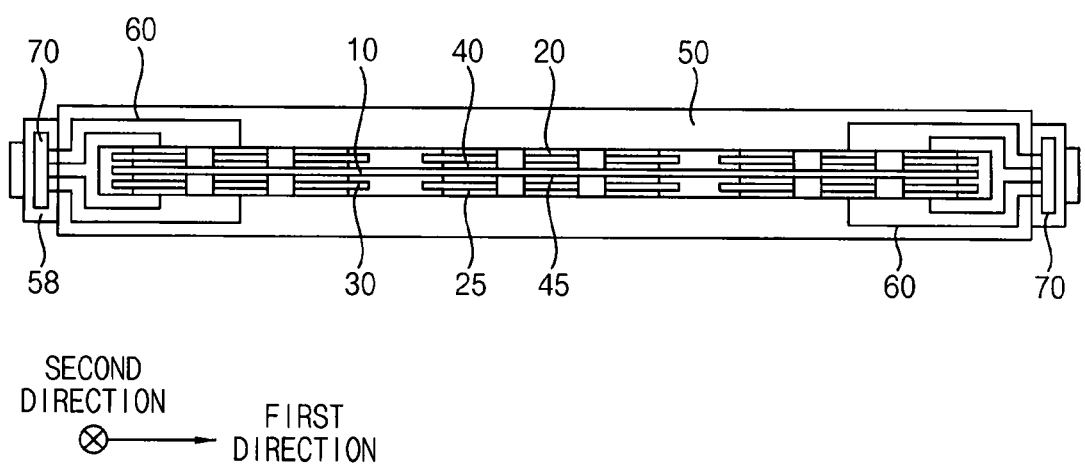

FIG. 2 is a perspective view illustrating a rotation body in accordance with some embodiments, FIG. 3 is a cross-sectional view illustrating a rotation structure cut along the line I-I' of FIG. 2, and FIG. 4 is a cross-sectional view illustrating a rotation structure cut along the line II-II' of FIG. 2.

Referring to FIGS. 2 to 4, the rotation structure 100 may include the rotation body 50, a first pad 20, a second pad 25, an adhesive 30, a third pad 40, a fourth pad 45 and the flexible panel 10.

Referring to FIG. 2, the rotation body 50 may have a circular cylinder shape or an elliptical cylinder shape extending in the first direction. That is, an outer circumference surface of the rotation body 50 may have a curved surface, so that the flexible display panel 10 may be easily wound.

At a central portion of the rotation body 50, an opening 52 may be disposed through the rotation body 50 in a second direction substantially perpendicular to the first direction. The opening 52 may extend in the first direction. A width of the opening 52 in the first direction may be substantially larger than a width of the flexible panel 10. Therefore, the flexible panel 10 may be arranged to penetrate the opening 52 of the rotation body 50.

The inner surfaces of the rotation body 50 which are exposed by the opening 52 may be defined as a first surface 54 and a second surface 55. In this case, the first surface 54 and the second surface 55 may be spaced apart from each other in a third direction substantially perpendicular to the first direction and the second direction. The first surface 54 and the second surface 55 may face each other.

Further, at end portions of the rotation body 50, protrusion portions 58 may be disposed. The protrusion portions 58 may have a diameter substantially smaller than that of the rotation body 50, and may project in the first direction. The protrusion portions 58 may direct contact an inner surface of the main body 200.

Referring to FIGS. 3 and 4, the first pad 20 and the second pad 25 may be disposed on the first surface 54 and the second surface 55 of the rotation body 50, respectively. In example embodiments, a plurality of first pads 20 may be arranged in the first direction, and a plurality of second pads 25 also may be arranged in the first direction. For example, the first pads 20 and the second pads 25 may be arranged in a zigzag pattern. The first pads 20 and the second pads 25 may be disposed on both surfaces 54 and 55 of the rotation body 50, so that a number of pads 20 and 25 may be arranged.

The first pad 20 and the second pad 25 may include a conductive material such as a copper, tungsten, silver or aluminum. The first pad 20 and the second pad 25 may serve as a signal pad for receiving a data signal.

The flexible display panel 10 may include an organic light emitting display panel or a liquid crystal display panel which have a predetermined flexibility. That is, elements of the flexible display panel 10, such as, for example, substrate, encapsulation layer may consist of a polymer material that is flexible. The flexible display panel 10 also may include a plurality of pixels having a switching structure such as a thin film transistor and a driving circuit portion. Therefore, the flexible display panel 10 may demonstrate a stopped image or a moving image depending on a data signal.

In example embodiments, one end portion of the flexible display panel 10 may be fixed to the rotation body 50. Remaining end portion of the flexible display panel 10 may be wound around the outer circumference surface of the rotation body 50.

The third pad 40 and the fourth pad 45 may be disposed on both surfaces of the flexible display panel 10. That is, the third pad 40 may be disposed on an upper surface of the flexible display panel 10, and the fourth pad 45 may be disposed on a lower surface of the flexible display panel 10. In example embodiments, a plurality of third pads 40 and a plurality of fourth pads 45 may be arranged in the first direction. Further, the third pads 40 may be arranged to correspond to the first pads 20, and the fourth pads 45 may be arranged to correspond to the second pads 25.

The adhesives 30 may be disposed between the first pad 20 and the third pad 40, and between the second pad 25 and the fourth pad 45. The adhesive 30 may include a material having a relatively large conductivity and relatively large bonding strength. In an example embodiment, the adhesive 30 may include an anisotropic conductive film (ACF). The anisotropic conductive film may include micro conductive particles such as nickel, carbon or a solder ball, and an adhesive polymer material. The adhesive 30 may not only mechanically hold the pads, but also electrically connect the pads. That is, the first pad 20 may be electrically connected to the third pad 40, and the second pad 25 may be electrically connected to the fourth pad 45.

The flexible display panel 10 may be fixed to the rotation body 50 by the adhesive 30. The pressure is applied from the upper surface and the lower surface of the flexible display panel 10, so that the flexible display panel 10 may be firmly fixed. That is, the first pad 20 may be fixed to the third pad 40, and the second pad 25 may be fixed to the fourth pad 45. Accordingly, even though the flexible display panel 10 is wound or unwound repeatedly, the connection between the flexible display panel 10 and the rotation body 50 may not be damaged.

Also, the third pads 40 and the fourth pads 45 may be disposed on both surfaces of the flexible display panel 10. Therefore, an area for receiving the signal pad (that is, the third pads 40 and the fourth pads 45) may be doubled. That is, more signal pads may be disposed on the flexible display panel 10. It is helpful for a high resolution flexible display panel 10 which includes a number of signal pads.

Referring to FIG. 4, a fifth pad 70 may be disposed in the protrusion portion 58 of the rotation body 50. The fifth pad 70 may be electrically connected to the first pad 20 and/or the second pad 25 by wirings 60 penetrating the rotation body 50. That is, the fifth pad 50 may serve to receive a signal from outside (that is, the main body 200). The wirings 60 may be a data line for transferring the signal.

In other example embodiments, the fifth pad 70 may be electrically connected to the first pad 20 and/or the second pad 25 by an auxiliary substrate (now shown) such as a flexible printed circuit board (FPCB).

Figure 5:
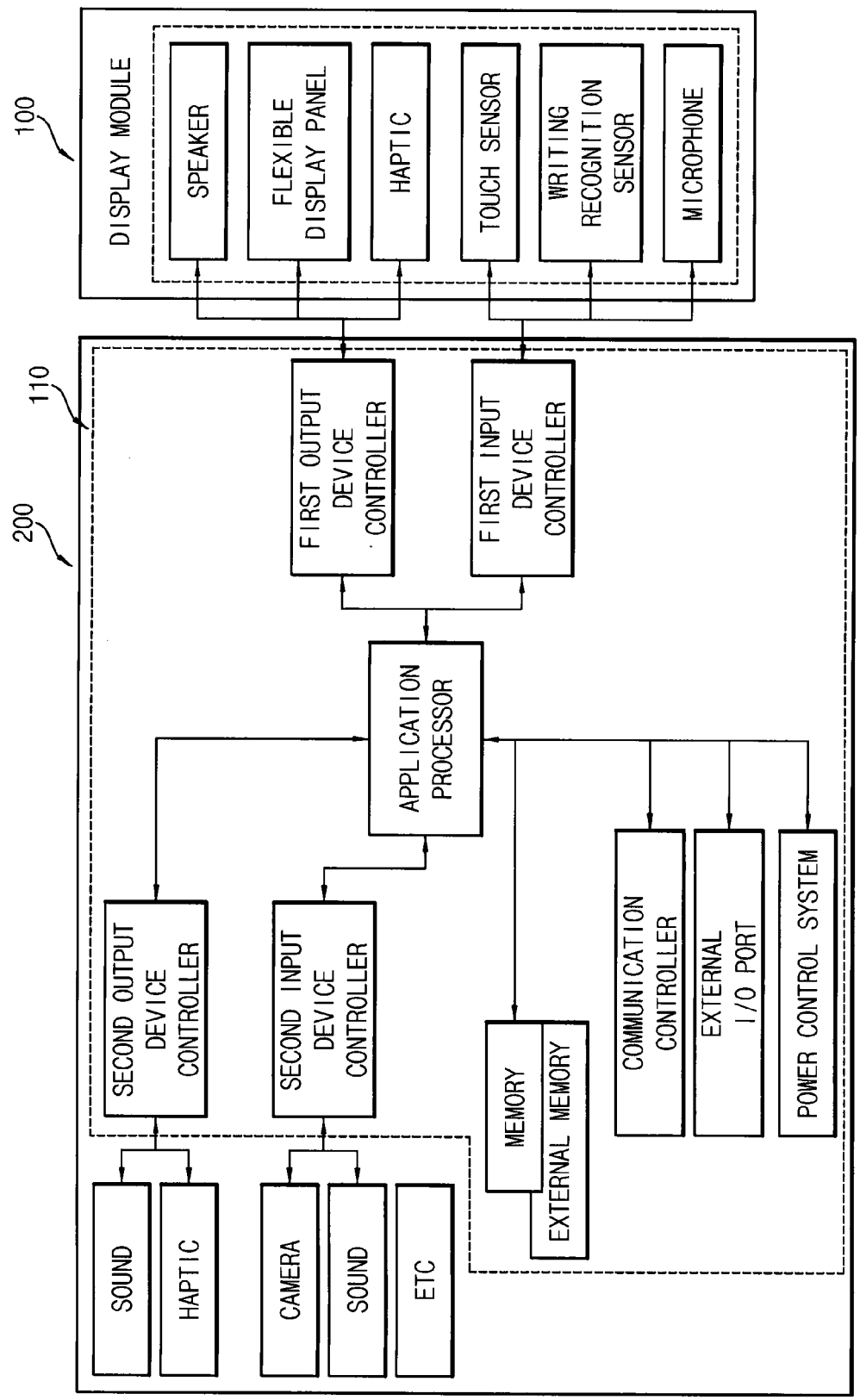

FIG. 5 is a block diagram illustrating a circuit structure of a flexible display apparatus in accordance with some embodiments.

The rotation structure 100 may include an image output device such as the flexible display panel 10, a sound output device such as a speaker, and other output devices such as a haptic device. Also, the rotation structure 100 may include an input device such as a touch sensor, a writing recognition sensor or a microphone.

The main body 200 may include a control circuit portion 110 (for example, an application processor) which may be responsible for the implementation and the control of the flexible display apparatus. The main body 200 may include an output device controller and output devices such as a sound output device and a haptic device. The main body 200 may further include an input device controller and input devices such as a sound input device and camera. Further, the main body 200 may include a main memory, an external memory, a communication controller, a power control system, and external I/O port, and the like.

The flexible panel 10 of the rotation structure 100 may receive an electrical signal from the control circuit portion 110 of the main body 200. The connection means between the control circuit portion 110 and the flexible panel 10 is described with reference to FIGS. 6 to 8. According to example embodiments, even though the rotation structure 100 rotates repeatedly, the data signal may be transferred stably from the main body 200 to the flexible panel 10.

Figure 6:
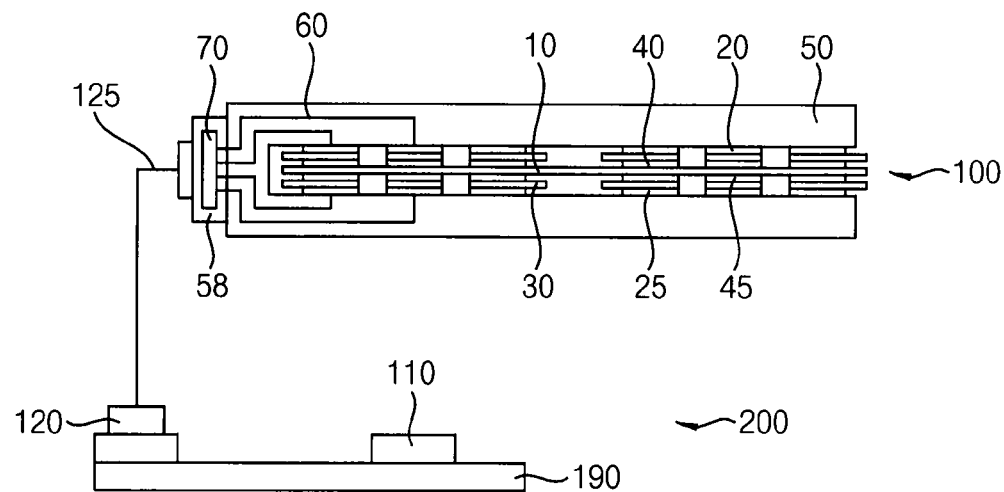

FIG. 6 is a cross-sectional view illustrating a connection means between a main body and a rotation structure in accordance with some embodiments.

Referring to FIG. 6, the rotation structure 100 and the main body 200 may be connected by a contact portion 120 and a cable portion 125. That is, the connection means may include the contact portion 120 and the cable portion 125. For the convenience of the explanation, FIG. 6 do not show all elements of the rotation structure 100 and the main body 200.

The main body 200 may include a substrate 190. In example embodiments, the substrate 190 may be fixed on the main body 200. Alternatively, the substrate 190 may be integrally formed on the main body 200.

The substrate 190 may serve as a main board of the flexible display apparatus. That is, a control circuit portion 110 (for example, an application processor) for controlling the flexible display apparatus and wirings may be disposed on the substrate 190.

Further, the contact portion 120 may be disposed on the substrate 190, and may be electrically connected to the control circuit portion 110. The contact portion 120 may include a connector and/or a signal pad. The contact portion 120 may serve to fix the cable portion 125 to the substrate 190.

One end portion of the cable portion 125 may be connected to the contact portion 120, and other end portion of the cable portion 125 may be connected to the fifth pad 70 of the rotation structure 100. The cable portion 125 may include a data line for transferring a signal to the flexible display panel 10, a power line for supplying a power to the flexible display panel 10, a ground line, an input signal line and/or an output signal line. In example embodiments, the cable portion 125 may have a predetermined flexibility, so that the data signal may be transferred stably from the main body 200 to the flexible panel 10, even though the rotation structure 100 rotates repeatedly.

Figure 7:
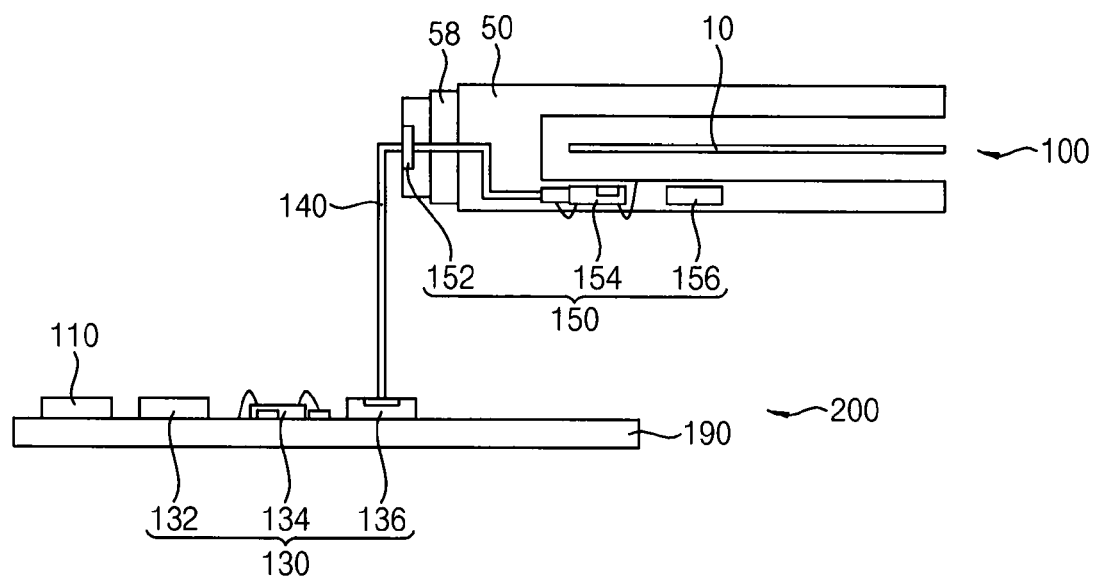

FIG. 7 is a cross-sectional view illustrating a connection means between a main body and a rotation structure of a flexible display apparatus in accordance with other embodiments. For the convenience of the explanation, FIG. 7 do not show all elements of the rotation structure 100 and the main body 200.

Referring to FIG. 7, the rotation structure 100 and the main body 200 may be connected by an optical transmitter 130, an optical receiver 150 and an optical cable 140 between the optical transmitter 130 and the optical receiver 150. That is, the connection means may include the optical transmitter 130, the optical cable 140 and the optical receiver 150.

The main body 200 may include a substrate 190. The substrate 190 may be substantially the same as or substantially similar to the substrate 190 described with reference to FIG. 6.

In example embodiments, the optical transmitter 130 may be disposed on the substrate 190. The optical transmitter 130 may include a multiplexer 132, a first driving circuit 134 and a light source 136. The multiplexer 132 may be electrically connected to the control circuit portion 110. The multiplexer 132 may select one of several analog or digital input signals and may forward the selected input signals into a single output line. The first driving circuit 134 may control the light source 136 to emit optical signals depending on the electrical signals from the multiplexer 132. In example embodiments, the light source 136 may include vertical cavity surface emitting layer (VCSEL) array. Then, the optical signals may be transferred to the optical receiver 150 through the optical cable 140.

One end portion of the optical cable 140 may be connected to the optical transmitter 130, and other end portion of the optical cable 140 may be connected to the optical receiver 150.

The optical receiver 150 may include an optical sensor 152, a second driving circuit 154 and a demultiplexer 156. In example embodiments, the optical sensor 152 may include a photo diode array. The optical sensor 152 may detect the optical signals from the optical cable 140. The second driving circuit 154 connected to the optical sensor 152 may convert the optical signals into the electrical signals. The demultiplexer may take a signal input signal and may select one of several output lines. In example embodiments, the optical receiver 150 may be disposed in the rotation body 50 as illustrated in FIG. 7.

Further, the second driving circuit 154, the demultiplexer 156 and pads 20 and 25 may be electrically connected by wirings 60 in the rotation body 50.

In example embodiments, the optical sensor 152 may be disposed in the protrusion portion 58 of the rotation body 50 as illustrated in FIG. 7. In other example embodiments, the optical sensor 152 may be disposed in the rotation body 50, and the optical cable 140 may be connected to the optical sensor 152 through the protrusion portion 58 of the rotation body 50.

According to example embodiments, the data signals may be transferred through the optical cable 140. Therefore, the transfer speed of the data signals may increase.

Figure 8:
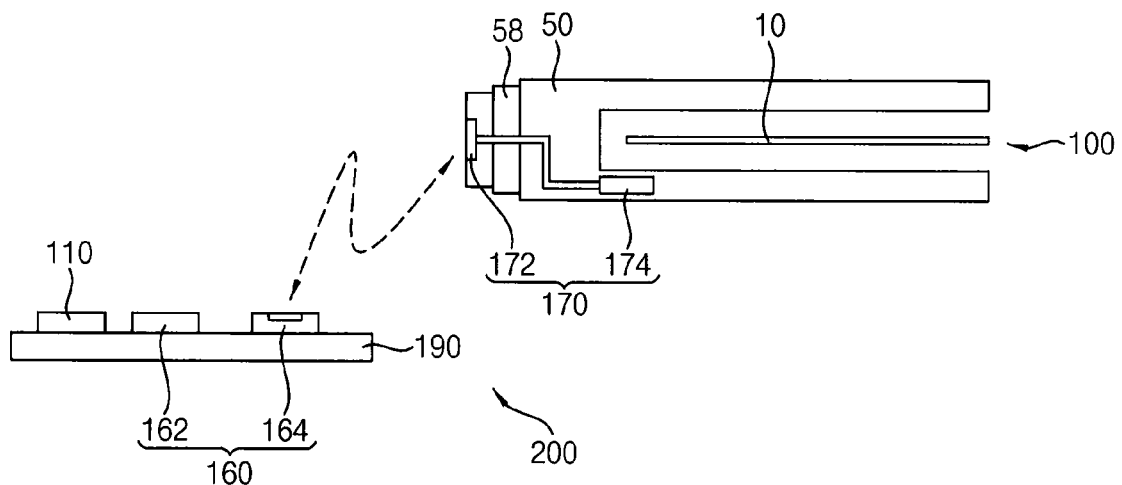

FIG. 8 is a cross-sectional view illustrating a connection means between a main body and a rotation structure of a flexible display apparatus in accordance with other embodiments. For the convenience of the explanation, FIG. 8 do not show all elements of the rotation structure 100 and the main body 200.

Referring to FIG. 8, the rotation structure 100 may include a wireless transmitter 160, and the main body 200 may include a wireless receiver 170. That is, the connection means may include the wireless transmitter 160 and the wireless receiver 170.

The main body 200 may include a substrate 190. The substrate 190 may be substantially the same as or substantially similar to the substrate 190 described with reference to FIG. 6.

The wireless receiver 170 including a transmitter circuit 162 and a first antenna 164 may be disposed on the substrate 190. The transmitter circuit 162 may include a frequency modulation circuit that may convert low frequency signals to high frequency signals and an amplifier circuit that may increase the power of the signals. The first antenna 164 may include a transducer designed to transmit electromagnetic waves depending on the electrical signals from the transmitter circuit 162.

The wireless receiver 170 may be disposed in the rotation body 50, and may include a receiver circuit 172 and a second antenna 174.

The second antenna 174 may include a transducer designed to receive the electromagnetic waves from the first antenna 164, and the receiver circuit 172 may include a demodulation circuit that may convert high frequency signals to low frequency signals, a noise filtering circuit, and the like.

Further, the receiver circuit 172, the second antenna 174 and pads 20 and 25 may be electrically connected by wirings 60 in the rotation body 50.

According to example embodiments, the data signals may be transferred between the rotation structure 100 and the main body 200 through the wireless communication. Therefore, even though the rotation structure 100 rotates repeatedly, a problem of cable kink may not occur.

FIGS. 9 to 13 are cross-sectional views illustrating a method of manufacturing a flexible display apparatus in accordance with some embodiments.

Figure 9:
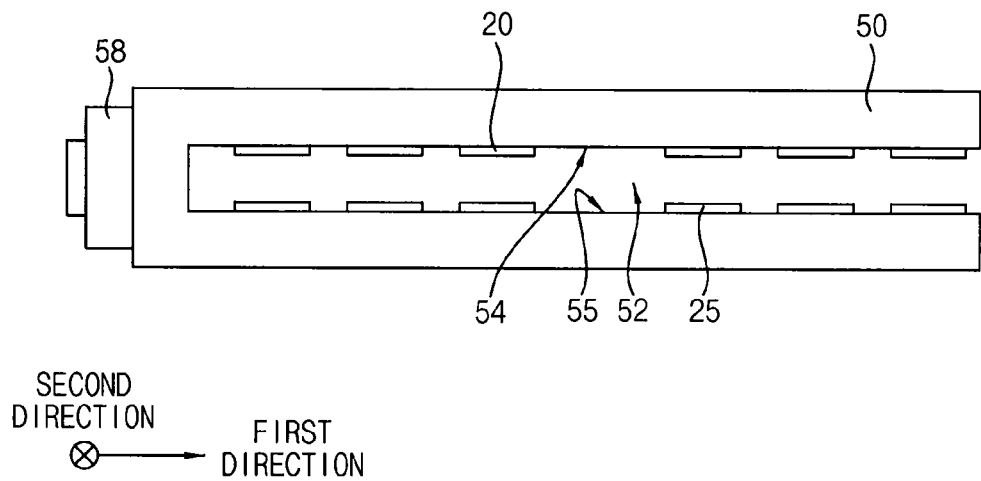

Referring to FIG. 9, a first pad 20 and a second pad 25 may be formed on surfaces of a rotation body 50.

The rotation body 50 may have a circular cylinder shape or an elliptical cylinder shape extending in the first direction. At a central portion of the rotation body 50, an opening 52 may be disposed through the rotation body 50 in a second direction substantially perpendicular to the first direction, and the opening 52 may extend in the first direction. The inner surfaces of the rotation body 50 which are exposed by the opening 52 may be defined as a first surface 54 and a second surface 55. In this case, the first surface 54 and the second surface 55 may be spaced apart from each other in a third direction substantially perpendicular to the first direction and the second direction, and the first surface 54 and the second surface 55 may face each other.

Further, at end portions of the rotation body 50, protrusion portions 58 may be disposed. The protrusion portions 58 may have a diameter substantially smaller than that of the rotation body 50, and may project in the first direction.

In example embodiments, the rotation body 50 may include an insulating material. For example, the rotation body 50 may include a polymer material or a ceramic.

The first pad 20 and the second pad 25 may be formed on the first surface 54 and the second surface 55 of the rotation body 50, respectively. The first pad 20 and the second pad 25 may include a conductive material. The first pad 20 and the second pad 25 may be assembled to the rotation body 50.

Figure 10:
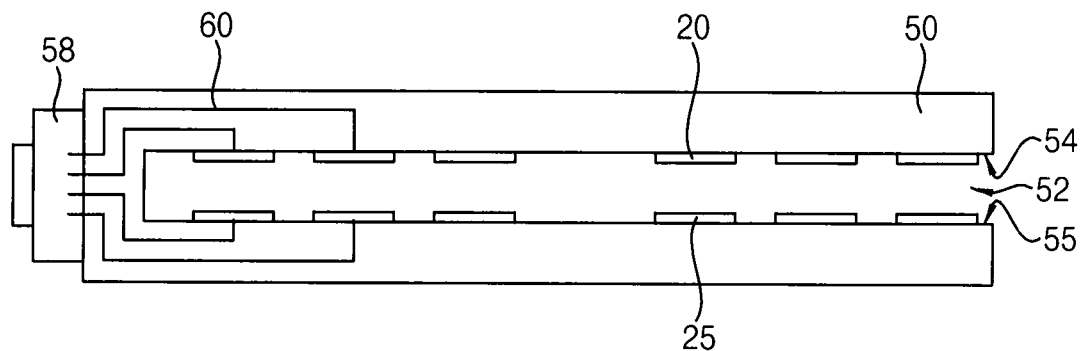
Figure 10:

Referring to FIG. 10, wirings 60 may be formed in the rotation body 50.

In example embodiments, the wirings 60 may be formed through the rotation body 50, and may be electrically connected to the first and second pads 20 and 25.

In other example embodiments, an auxiliary substrate (now shown) may be disposed in the rotation body 50, and the auxiliary substrate and the first and second pads 20 and 25 may be connected by the wirings 60. For example, the auxiliary substrate may be adhered to the rotation body 50 by an ultrasonic bonding, a thermal boding or a soldering process.

Figure 11:
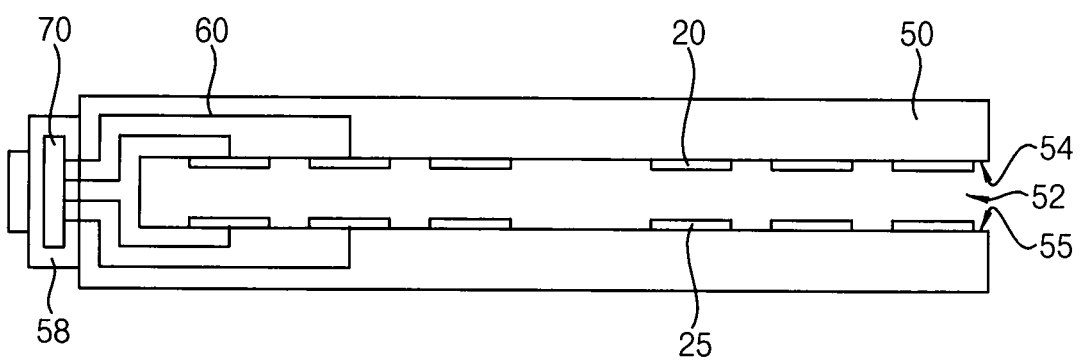
Figure 11:

Referring to FIG. 11, a fifth pad 70 may be formed at the protrusion portion 58 of the rotation body 50. The fifth pad 70 may include a conductive material substantially the same as those of the first and second pads 20 and 25. The fifth pad 70 may be disposed in the protrusion portion 58, or may be disposed on the protrusion portion 58.

Figure 12:
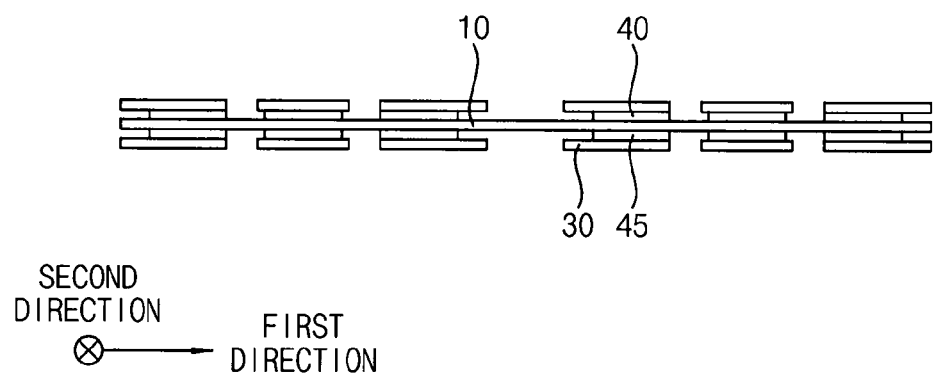

Referring to FIG. 12, a third pad 40 and a fourth pad 45 may be formed on both surfaces of a flexible display panel 10, and an adhesive 30 may be formed on the third pad 40 and the fourth pad 45.

The third pad 40 may be formed on an upper surface of the flexible display panel 10, and the fourth pad 45 may be formed on a lower surface of the flexible display panel 10. In example embodiments, a plurality of third pads 40 and a plurality of fourth pads 45 may be arranged in the first direction. Further, the third pads 40 may be arranged to correspond to the first pads 20, and the fourth pads 45 may be arranged to correspond to the second pads 25.

The adhesive 30 may be formed on the third pad 40 and the fourth pad 45. The adhesive 30 may include a material having a relatively large conductivity and relatively large adhesion strength. For example, the adhesive 30 may include an anisotropic conductive film (ACF). The anisotropic conductive film may include micro conductive particles such as nickel, carbon or a solder ball, and an adhesive polymer material.

Figure 13:
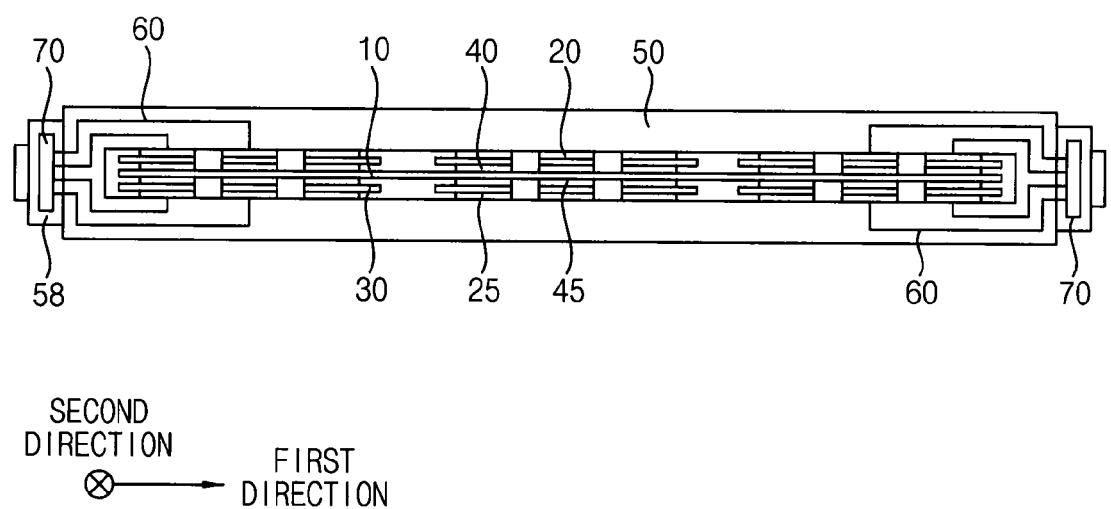

Referring to FIG. 13, the flexible display panel 10 may be arranged through the opening 52 of the rotation body 50, and then the flexible display panel 10 and the rotation body 50 may be assembled.

Referring to FIG. 13, the flexible display panel 10 may be arranged to penetrate the opening 52 of the rotation body 50. Then, the flexible display panel 10 and the rotation body 50 may be assembled.

After arranging the third and fourth pads 40 and 45 corresponding to the first and second pads 20 and 25, a pressure may be applied to the adhesive 30. When the pressure is applied to the adhesive 30, the bonding strength of the adhesive 30 may increase, so that the flexible display panel 10 and the rotation body 50 may be mechanically fixed each other. The steps of fixing the flexible display panel 10 and the rotation body 50 will be described with reference to FIGS. 14 to 16.

Figure 14:
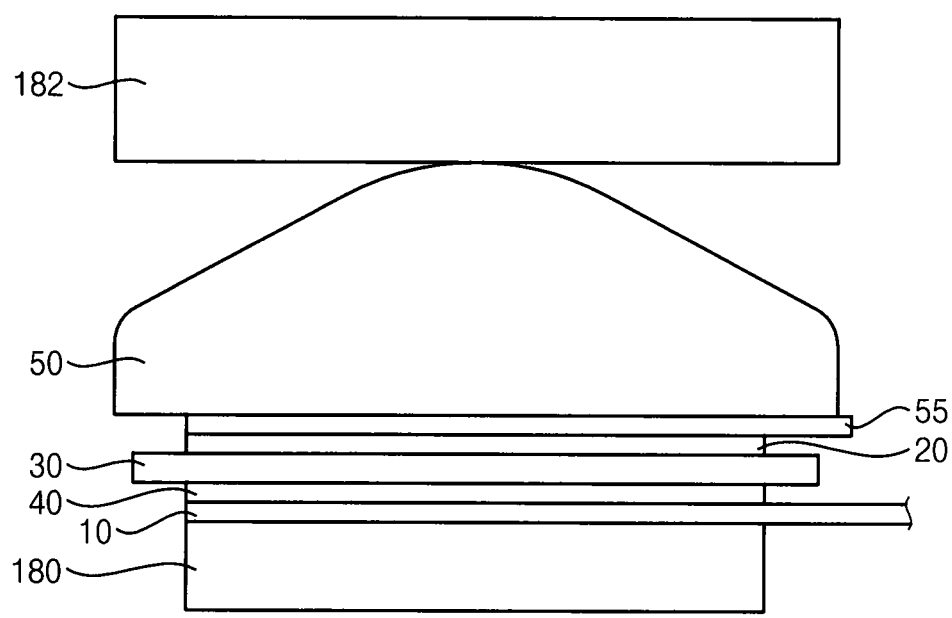

FIG. 14 is a cross-sectional view illustrating a step of fixing a flexible display panel and a rotation body in accordance with some embodiments.

Referring to FIG. 14, the flexible display panel 10 and the rotation body 50 may be adhered using a thermal compression jig 182.

In example embodiments, the third pad 40 may be disposed on the flexible display panel 10, and the first pad 20 may be disposed on an auxiliary substrate 55 of the rotation body 50. Further, the adhesive 30 may be disposed between the first pad 20 and the third pad 40. For example, the adhesive 30 may include an anisotropic conductive film.

The flexible display panel 10 having the first pad 20 may be disposed on a supporting jig, and then the thermal compression jig 182 may descend gradually to apply a pressure and a heat to the rotation body 50. The pressure and the heat may be transferred to the adhesive 30, so that the first pad 20 and the third pad 40 may be fixed firmly.

Figure 15:
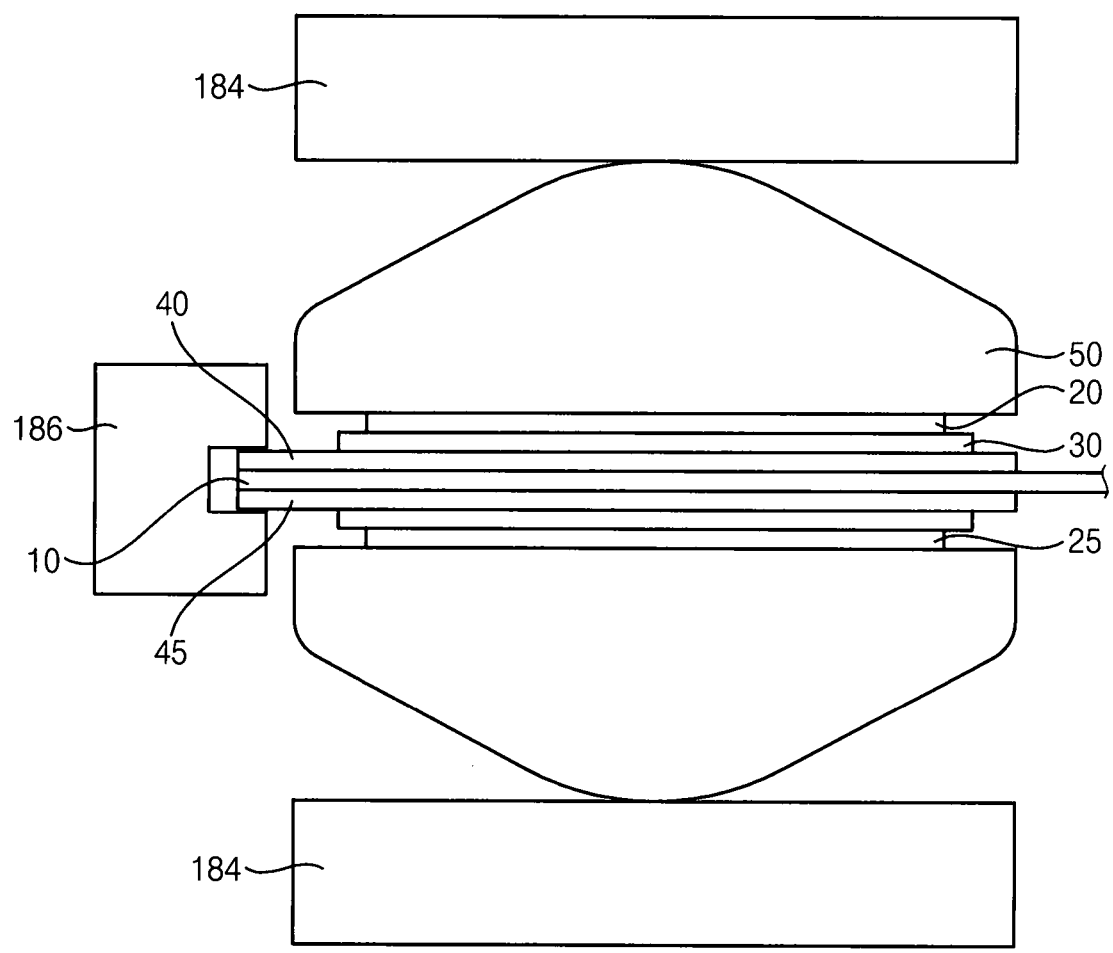

FIG. 15 is a cross-sectional view illustrating a step of fixing a flexible display panel and a rotation body in accordance with other embodiments.

Referring to FIG. 15, the flexible display panel 10 and the rotation body 50 may be adhered using a thermal transfer jig 186 and a compression jig 184.

In example embodiments, the third pad 40 and the fourth pad 45 may be disposed on both surfaces of the flexible display panel 10, and the first pad 20 and the second pad 25 may be disposed on the rotation body 50. Further, the adhesive 30 may be disposed between the first pad 20 and the third pad 40, and between the second pad 25 and the fourth pad 45. For example, the adhesive 30 may include an anisotropic conductive film.

The compression jig 184 may apply a pressure to the rotation body 50 from upside and downside thereof. The pressure may be transferred to the adhesive 30, so that the first pad 20 and the third pad 40 may be fixed firmly. The thermal transfer jig 186 may apply a heat from the third pad 40 and the fourth pad 45 to the adhesive 30.

In example embodiments, the compression jig 184 and the thermal transfer jig 186 may be separated. Further, the thermal transfer jig 186 may apply the heat through the third pad 40 and the fourth pad 45, so that the rotation body 50 may not be thermally damaged.

Figure 16:
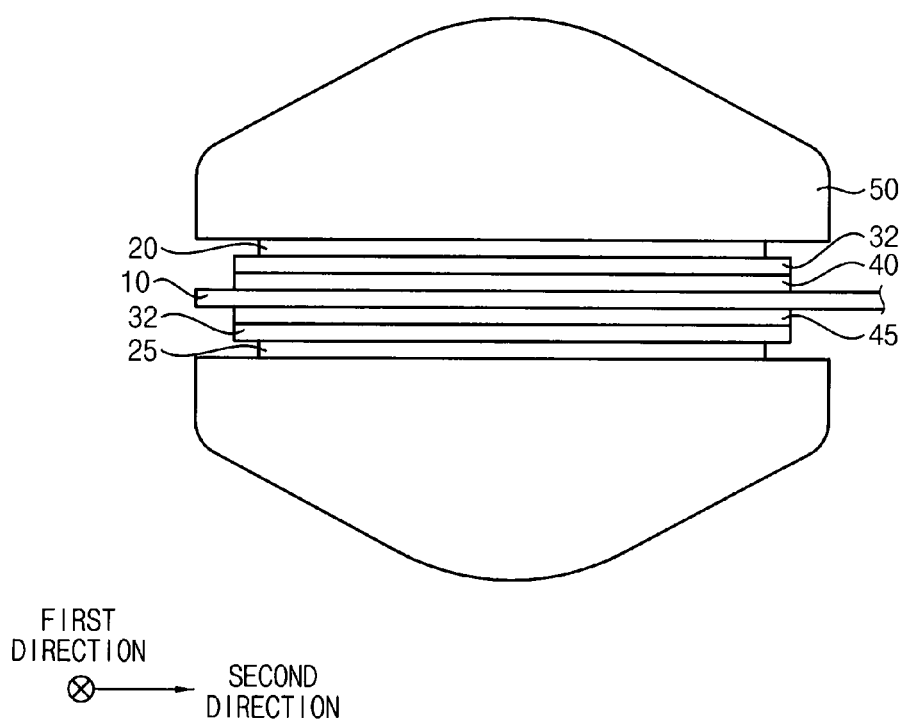

FIG. 16 is a cross-sectional view illustrating a step of fixing a flexible display panel and a rotation body in accordance with other embodiments.

Referring to FIG. 16, the flexible display panel 10 and the rotation body 50 may be fixed by a conductive resin.

In this case, an adhesive 32 may be disposed between the first pad 20 and the third pad 40, and between the second pad 25 and the fourth pad 45. The adhesive 32 may include the conductive polymer material, and the conductive polymer material may have an adhesive strength due to an ultraviolet irradiation.

According to example embodiments, the inventive concepts may be applied to all electric apparatuses. For example, the inventive concepts may be applied to not only in a stationary electric apparatus such as a monitor, a television, a digital information display (DID) apparatus, but also in a portable electric apparatus such as a notebook, a digital camera, a mobile phone, a smart phone, a smart pad, a personal digital assistant (PDA), a personal media player (PMP), a MP3 player, a navigation system, a camcorder, a portable game machine, and the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A flexible display apparatus, comprising:
   a main body including a control circuit portion;
   a rotation structure in the main body, the rotation structure including a rotation body and a flexible display panel, the rotation body configured to rotate about an axis extending in a first direction, the flexible display panel being fixed to the rotation body, wherein the rotating body has a circular cylinder shape or an elliptical cylinder shape extending in the first direction;
   a signal transfer portion transferring a signal between the control circuit portion and the flexible display panel; and
   at least one first pad, at least one second pad, at least one third pad, at least one fourth pad and an adhesive,
   wherein the at least one first pad and the at least one second pad are disposed on surfaces of the rotating body,
   wherein the at least one third pad and the at least one fourth pad are disposed at an end portion of the flexible display panel, and
   wherein the adhesive is disposed between the at least one first pad and the at least one third pad and between the at least one second pad and the at least one fourth pad.

2. The flexible display apparatus of claim 1, wherein the signal transfer portion comprises:
   an optical transmitter disposed on the substrate;
   an optical receiver disposed in the rotation structure; and
   an optical cable connecting the optical transmitter with the optical receiver.

3. The flexible display apparatus of claim 2, wherein the optical transmitter includes a multiplexer, a first driving circuit and a light source, and wherein the optical receiver includes an optical sensor, a second driving circuit and a demultiplexer.

4. The flexible display apparatus of claim 1, wherein the signal transfer portion comprises:
   a wireless transmitter disposed on the substrate; and
   a wireless receiver disposed in the rotating structure.

5. The flexible display apparatus of claim 4, wherein the wireless transmitter includes a transmitter circuit and a first antenna, and wherein the wireless receiver includes a receiver circuit and a second antenna.

6. The flexible display apparatus of claim 1, wherein the at least one first pad is disposed on a first surface of the rotating body exposed by the opening, wherein the at least one second pad is disposed on a second surface of the rotating body exposed by the opening, wherein the at least one third pad is disposed on an upper surface of the flexible display panel, wherein the at least one fourth pad is disposed on a lower surface of the flexible display panel, wherein the first surface and the second surface face each other, and wherein the upper surface opposes to the lower surface.

7. The flexible display apparatus of claim 1, wherein the flexible display panel is disposed through the opening, and wherein the upper surface and the lower surface of the flexible display panel are fixed to the rotation body.

8. The flexible display apparatus of claim 1, further comprising a substrate fixed to the main body or integrally formed on the main body, wherein the control circuit portion is disposed on the substrate.

9. The flexible display apparatus of claim 8, wherein the signal transfer portion comprises:
- a contact portion including a connector or a signal pad on the substrate; and
- a cable portion including at least one of a data line, a power line, a ground line and an input signal line or an output signal line, the cable portion connecting the contact portion with the rotation structure.

* * * * *